United States Patent [19]
Floryan et al.

[11] Patent Number: 5,417,766
[45] Date of Patent: May 23, 1995

[54] CHANNEL EVAPORATOR

[75] Inventors: Richard F. Floryan, Roanoke, Va.; David D. Frisch, Fort Wayne, Ind.

[73] Assignee: ITT Corporation, New York, N.Y.

[21] Appl. No.: 233,884

[22] Filed: Apr. 26, 1994

[51] Int. Cl.⁶ .................... F27B 14/04; F27B 14/10
[52] U.S. Cl. .................... 118/726; 118/725; 392/389
[58] Field of Search .............. 118/726; 392/388, 389, 392/399, 403

[56] References Cited
U.S. PATENT DOCUMENTS

| | | | |
|---|---|---|---|
| 3,598,384 | 8/1971 | Zucchinelli | 266/39 |
| 3,647,197 | 3/1972 | Holloway | 263/47 R |
| 4,286,545 | 9/1981 | Takagi | 118/723 |
| 4,588,023 | 5/1986 | Munekawa | 165/104.33 |
| 4,812,326 | 3/1989 | Tsukazaki | 427/38 |
| 4,856,457 | 8/1989 | Knauer | 118/666 |
| 5,252,134 | 10/1993 | Stauffer | 118/726 |

*Primary Examiner*—R. Bruce Breneman
*Assistant Examiner*—Jeffrie R. Lund
*Attorney, Agent, or Firm*—Arthur L. Plevy; Patrick M. Hogan

[57] ABSTRACT

An evaporator for containing a second material which is to be evaporated onto a remotely located surface after a first evaporation of a first material, comprises a tubular member having crimped ends for preventing the second material from combining with the first material during the first evaporation thereof and an aperture for allowing the escape of the second material from the evaporator during evaporation of the second material, the aperture being formed on a flattened area of the tubular member.

21 Claims, 4 Drawing Sheets

CHANNEL EVAPORATOR

RELATED APPLICATIONS

There are several co-pending applications, each of which are assigned to ITT Corporation, the assignee herein, and each of which relate to image intensifier devices which utilize photocathodes. Reference is made herein to the following applications: U.S. patent application Ser. No. 07/919,766 filed on Jul. 24, 1992, now abandoned, and entitled CONDUCTIVE COATING FOR AN IMAGE INTENSIFIER TUBE MICRO-CHANNEL PLATE and U.S. patent application Ser. No. 08/020,650, now U.S. Pat. No. 5,219,177 entitled IMAGE INTENSIFIER TUBE.

FIELD OF THE INVENTION

This invention relates generally to an evaporation device used in the formation of a photocathode and more particularly, to a channel evaporator used for evaporating a photo-sensitive material onto a glass faceplate to form a photocathode.

BACKGROUND OF THE INVENTION

Photoemission involves a process whereby a photon impinging on a solid surface causes a photo-electron to be ejected from that surface. The solid surface which emits the photo-electron in response to the impinging photon is referred to as a photocathode. The photo-electron that is emitted from the photocathode can be collected or amplified for detection by other processes, for instance, secondary emission.

The efficiency of the photoemission in photo-electrons per incident photon, and how it changes according to wavelength are characteristics that are associated with photocathodes.

As is well known, photocathodes are used in imaging type photo-detector devices. An example of such a device is an image intensifier tube. Image intensifier tubes amplify a low intensity or non-visible radiational image of an object into a readily viewable image. Image intensifier tubes find many industrial and military applications including enhancing the night vision of aviators, rendering night vision to persons who suffer from retinitis pigmentosa, more commonly known as night blindness and photographing astronomical bodies.

Shown in FIG. 1 is an example of a prior art GEN II image intensifier tube 10 known as a proximity focused image intensifier tube. Image intensifier tube 10 includes an input window 12 formed from a glass or a fiber optic faceplate. The back of the faceplate has applied to it a photocathode 14. A microchannel plate (MCP) 16, which consists of an array of microscopic channels formed in a thin glass plate and serves as electron multiplier, is spaced from and mounted parallel with the photocathode 1414. The MCP 16 includes an input electrode 24 on the input surface and an output electrode 26 on the output surface. An output window 18 is located on the other side of MCP 16 and is provided with a phosphor screen 20. The output window is also formed from a fiber optics faceplate or glass. The input window 12 and output window 18 are mounted on opposing ends of a vacuum housing 22 with the MCP 16 positioned intermediate therebetween within the vacuum housing. The tube is provided with electrical leads for applying appropriate desired voltages to the photocathode 14, the input electrode 24, the output electrode 26, and the phosphor screen 20.

In operation, incident photons coming from an external object impinges upon the photocathode 14. The photocathode 14 converts the incident photons into photo-electrons. The electrons generated by the photocathode 14 are subsequently emitted into the vacuum housing 22. The electrons emitted by the photocathode 14 are accelerated toward the input surface of the MCP 16 by applying a potential applied across the input electrode 24 of the MCP 16 and the photocathode 14.

When an electron enters one of the channels of the MCP 16 at the input surface, a cascade of secondary electrons is produced from the channel wall by secondary emission. The cascade of secondary electrons are emitted from the channel at the output surface of the MCP 16 and are accelerated toward the phosphor screen 20 to produce an intensified image. Electrons exiting the MCP 16 are accelerated toward the phosphor screen 20 by the potential difference applied between the output electrode 26 of the MCP 16 and the phosphor screen 20. As the exiting electrons impinge upon the phosphor screen 20, many photons are produced per electron. The photons create an intensified output image on the output surface of an optical inverter element 28.

A number of materials have been developed over the years which are useful in forming photocathodes for a wide variety applications. Photocathodes used for near UV and visible light are typically made from compounds of alkali metals, usually cesium (Cs), potassium (K), or sodium (Na), with antimony (Sb). These compounds are such that they must be prepared in ultrahigh vacuums.

GEN II image intensifier tubes are well known in the art and use the alkali antimonide, positive affinity, photocathode described immediately above. As described earlier, the photocathode consists of a glass faceplate wherein one surface of the faceplate has deposited thereon a photocathode layer of photoemissive material.

The photocathode layers are deposited onto faceplates using well known chemical vapor deposition techniques. Briefly, chemical vapor deposition (CVD) involves a technique whereby a thin film of either a conductive or insulative material is formed on a substrate by supplying energy for a gas phase reaction. The energy may be supplied by heat, plasma excitation, or optical excitation.

For an example of a method for manufacturing a photocathode used in image intensifier device, see U.S. Pat. No. 4,999,211 entitled APPARATUS AND METHOD FOR MAKING A PHOTOCATHODE issued to Daniel D. Duggan on Mar. 12, 1991 and assigned to the assignee herein, ITT Corporation.

Multi-alkali type photocathodes used in GEN II image intensifier tubes are typically made by a CVD process which involves evaporating for instance, antimony (Sb) onto the surface of a faceplate. An example of such a technique is known as a remote-process system. This technique consists of a "process can", which is usually manufactured from stainless steel. The process can contains the elements that react to form the photocathode layer on the surface of the face plate. The alkali elements are evaporated into the can along with Sb to form the photocathode layer.

The Sb is introduced into the can using an evaporator which consists of a bead of Sb wetted to a wire. Current is passed through the wire, causing the Sb to melt and evaporate onto the faceplate.

This method suffers from several drawbacks. One drawback involves crust formation on the bead of photo-sensitive material. This occurs when the alkali vapor combines with the bead. In order for pure bead material to be available for evaporation onto the faceplate, the crust formed on the bead must be evaporated off first which impacts negatively on the photocathode sensitivity.

Another drawback involves embrittlement of the bead which causes the bead to fall off the wire during the evaporation process thereby, preventing completion of the process. This problem is generally caused by bead being exposed to the Alkali vapor during the evaporation process. Consequently, completion of the process requires two or more beads assemblies to be mounted in the can to provide a backup in case this occurs. This solution is quite costly as each bead and wire assembly is relatively expensive to manufacture.

Therefore, there exists a need in the art of for a method of depositing a photosensitive material onto a faceplate during the manufacturing of a photocathode that avoids the problems of prior art techniques.

It is therefore, a primary objective of the present invention to provide an evaporator that protects the photosensitive material provided thereby from the detrimental effects of the alkali vapor during photocathode formation.

SUMMARY OF THE INVENTION

An evaporator for containing a second material which is to be evaporated onto a remotely located surface after a first evaporation of a first material, comprising shielding means for preventing said second material from combining with the first material during the first evaporation thereof.

The shielding means of the present invention can be formed from a third material which will not vaporize or alloy at the vaporization temperature of the second material.

The shielding means can further include escape means for allowing the escape of the second material from said evaporator during evaporation of the second material.

The shielding means can still further include a tubular member having sealing means for further preventing the second material from combining with the first material during the first evaporation thereof.

The sealing means can include at least one crimp in each of the tubular member.

Also according to the present invention, a method of making an evaporator used for evaporating a second material onto a remotely located surface after a first evaporation of a first material, the method comprising the steps of providing shielding means for preventing the second material from combining with the first material during the first evaporation thereof, flattening a portion of the shielding means, forming escape means for allowing the second material to evaporate onto the remotely located surface, and placing the second material into the shielding means.

The method can also include the step of sealing the shielding means to further prevent the second material from combining with the first material during the first evaporation thereof.

Figure 1:
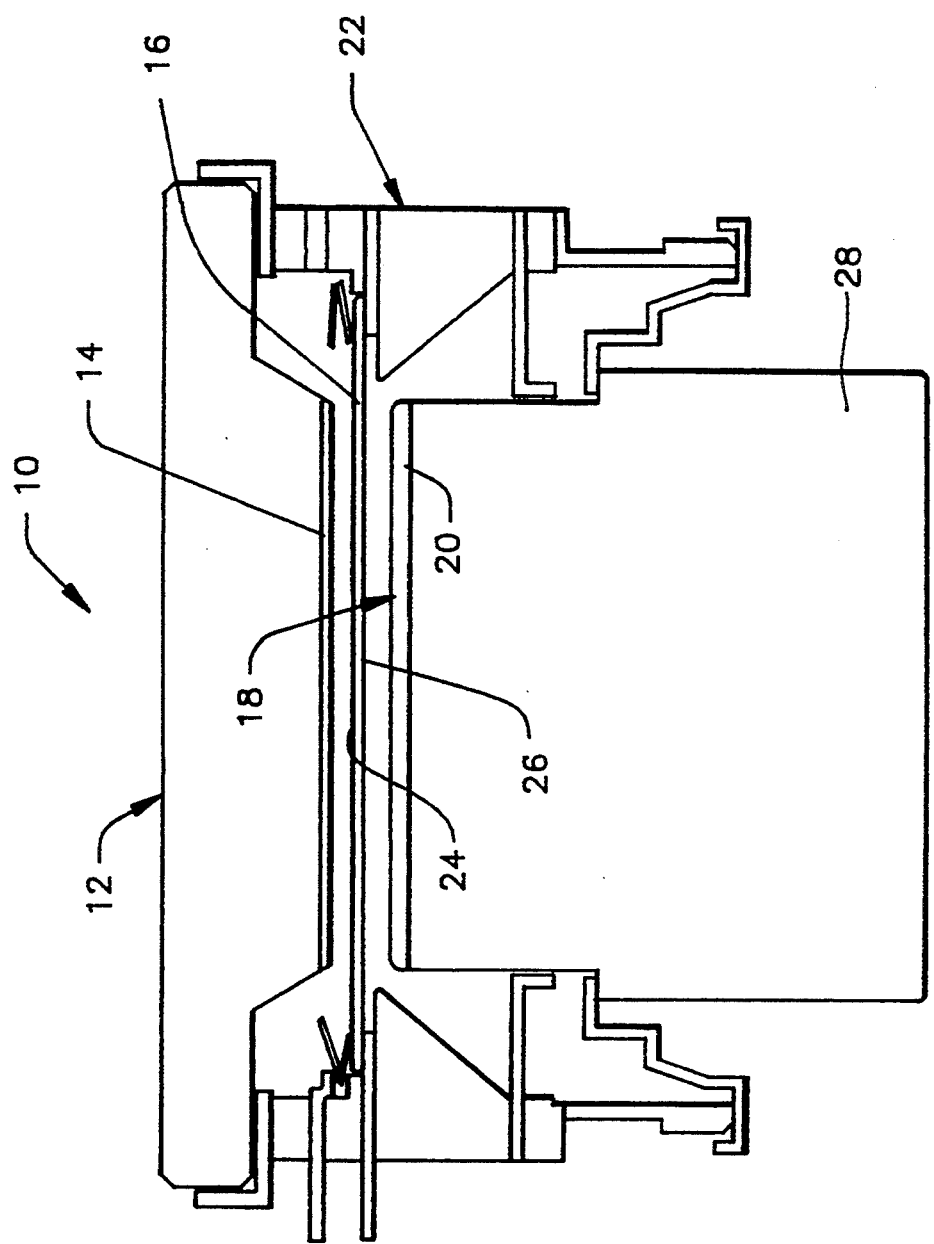
FIG. 1 is a cross-sectional view of a prior art GEN II image intensifier tube.
Figure 2A:
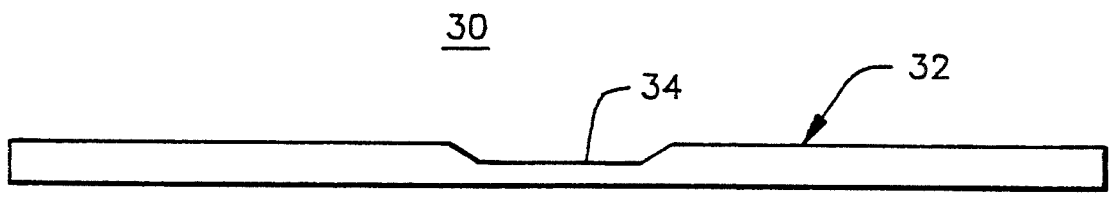
Figure 2B:
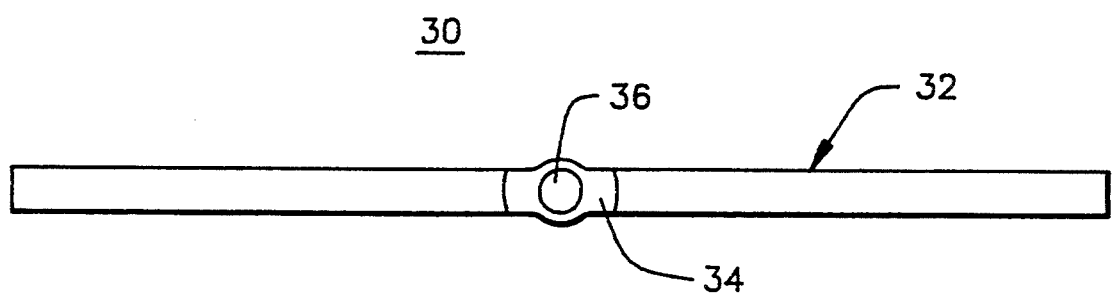
Figure 3A:
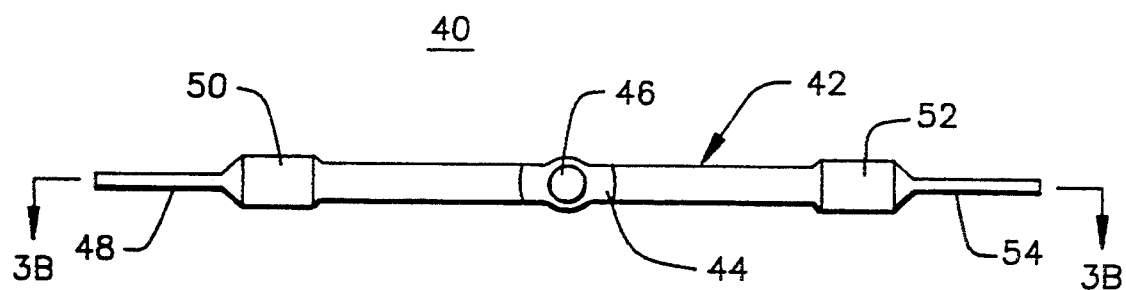
Figure 3B:
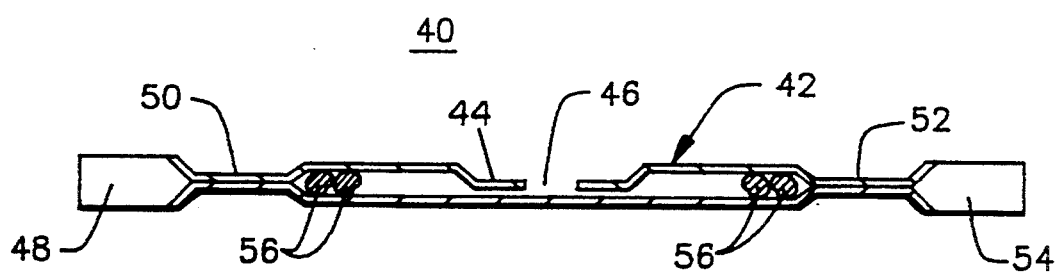
Figure 4:
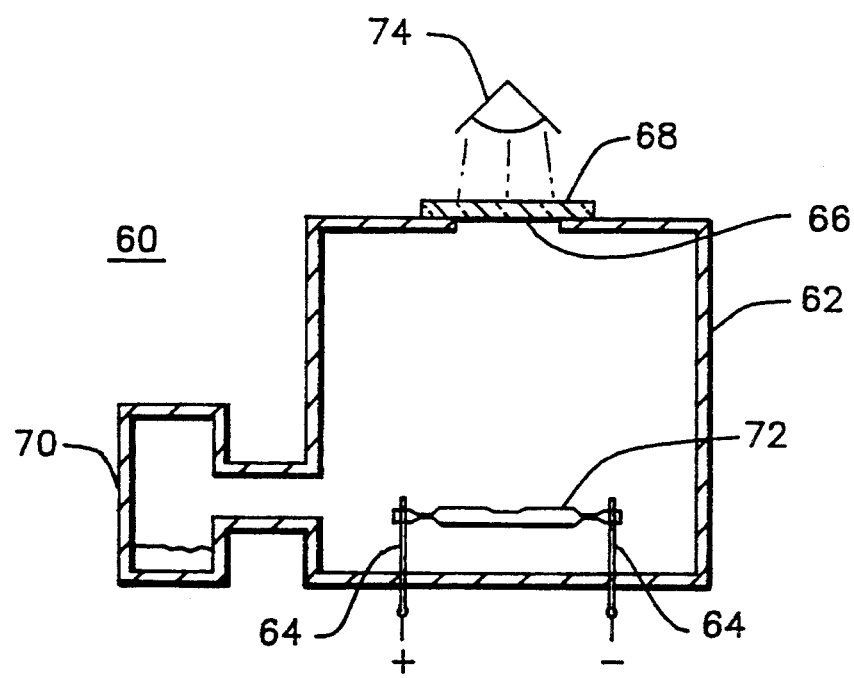

FIG.. 2A is an elevational view of a section of tubing which is used to fabricate the channel evaporator of the present invention;

FIG. 2B is a top view of the section of tubing shown in FIG. 2A;

FIG. 3A is a top view of the channel evaporator of the present invention;

FIG. 3B is a cross-sectional view through line 3B—3B of the channel evaporator of FIG. 3A;

FIG. 4 is schematic view of a remote process system which uses the channel evaporator of the present invention.

DETAILED DESCRIPTION OF THE INVENTION

In the description which follows, it should be understood that any reference to either orientation or direction is intended only for the purpose of illustration and is not in any way intended to be a limitation of the scope of the present invention. Further, while if is presently intended that the present invention be used for evaporating antimony, as described herein, the present invention is not limited to use as such and consequently, may be used for evaporating any material as desired by the user.

With reference to FIG. 2A, there can be seen an elevational view of a section of tubing 32 which is used to fabricate the channel evaporator 30 of the present invention. The tubing can be made from any suitable material which does not vaporize or alloy with the material contained inside during evaporation. In an exemplary embodiment of the present invention, the tubing is made from stainless steel. The tube section 32 is cut to a length preferably between 1.5 and 2.0 inches. The preferred diameter of the tube section is approximately 0.060 of an inch. The preferred wall thickness of the tube section is between 0.002 and 0.004 inches. It is understood, of course, that the tube section can be of any suitable length, diameter, and wall thickness depending upon the amount and type of material being evaporated.

Referring still to FIG. 2A, an area approximately forming the center of the tube is then provided with a flattened portion 34. The wall of the tube is flattened such that the tube is not closed. The flattened portion 34 is preferably about 0.250 inches along the length of the tube. The length of the flattened portion 34 is chosen to allow an aperture 36 shown in FIG. 2B to be formed in the wall of the tube section by drilling or any other suitable technique. Preferably, the aperture 36 is approximately 0.060 inches in diameter, however any suitable diameter aperture is possible depending upon the desired speed of evaporation, etc.

Referring now to FIGS. 3A and 3B, there is shown a finished channel evaporator 40 filled with small chunks of photo-sensitive material to be evaporated. In FIG. 3A, the top view of the channel evaporator is shown. Channel evaporator 40 includes tube section 42, flattened portion 44 and aperture 46. The ends of the channel evaporator are each filled with small chunks 56 of photosensitive material such as antimony as shown in FIG. 3B. After filling the ends of the channel evaporator with the desired photosensitive material, the ends are sealed by making four crimps 48, 50, 52, and 54.

Each end includes two of the four crimps. Each pair of crimps define two flattened areas which lie in planes that are 90° apart. The photo-sensitive material is stored inwardly adjacent to the each set of crimps as shown FIG. 3B. The tube is sufficiently flattened at each crimp to seal off the tube. Two crimps are provided in each end of the tube to ensure complete sealing of the tube so that the photosensitive material contained therein is shielded from the detrimental effects of the external atmosphere.

The channel evaporator of the present invention is intended to be used as shown in FIG. 4 in a remote-process system 60. It is understood, however, that the channel evaporator of the present invention can be used in any other type of system.

The remote-process system 60 consists of a process can 62. The process can is an enclosure that is typically made of stainless steel. The process can is designed to contain the elements which are to be evaporated therein and which react with each other to form the photocathode.

The channel evaporator 72 is mounted to the bottom of the process can using a suitable holding fixture 64. The top of the can includes an aperture 66. On the other side of aperture 66 is mounted a glass faceplate 68. The channel evaporator is oriented such that the aperture of the channel evaporator 72 is facing the surface of the faceplate where the photocathode is to be deposited. This orientation allows the material in the channel evaporator to evaporate directly onto the glass faceplate 68. Alkali elements are generated in an appendage 70 which is a separate container attached to the sidewall of the process can. The alkali elements contained in the appendage fill the process can volume in a vapor form and combine chemically with the material evaporated from the channel evaporator to form the photocathode.

In the case of forming a multi-alkali photocathode using antimony, the evaporation process is performed by maintaining the process can assembly in an ultra-high vacuum chamber (not shown), at a temperature of approximately 200° C. A current of approximately 3 to 3.5 amps applied to the channel evaporator via holding fixture 64 which causes the antimony to evaporate. The photoresponse of the photocathode formed on the surface of the faceplate is continuously monitored during formation by applying a voltage between the faceplate and a collector (not shown) located within the process can, while illuminating the faceplate with a light source 74.

A typical process using a channel evaporator of the present invention filled with Sb consists of first introducing an alkali element, followed by an Sb evaporation. After Sb evaporation, another layer of alkali is deposited and so on until the desired structure is developed. The entire process usually takes 4 to 8 hours to complete.

The channel evaporator according to the present invention, prevents alkali vapor from combining with the material to be evaporated because the material is contained within the evaporator tube, thereby shielding it from the alkali vapor. This has the effect of increasing photocathode sensitivity as no crust has to be evaporated off before pure material is evaporated. Further, because the ends of the evaporator tube are sealed off, the material contained within the evaporator tube, cannot fall out of the tube, thus only one evaporator assembly is needed per photocathode instead of the usual two or three wire/bead assemblies of the prior art technique.

In over 100 photocathode runs using the channel evaporator of the present invention, none have experienced a failure of the channel evaporator.

Moreover, the channel evaporator according to the present invention costs only about one tenth as much to produce as a wire/bead evaporator assembly thereby greatly reducing the cost of the photocathode.

It is understood that the embodiment of the channel evaporator described herein is merely exemplary and that a person of ordinary skill in the art may make many variations and modifications to the described embodiment. Any variations, use or adaptions of the invention described herein are intended to be included within the scope of the invention as defined by the appended claims.

We claim:

1. An evaporator for containing a second material which is to be evaporated onto a remotely located surface after a first evaporation of a first material thereon, comprising:
   shielding means for substantially preventing said second material from combining with the first material during the first evaporation thereof, said shielding means defining a curved surface;
   a flattened area formed on said curved surface of said shielding means; and
   escape means for enabling the escape of said second material from said evaporator during evaporation thereof.

2. The evaporator according to claim 1, wherein said shielding means is formed from a third material which will not vaporize at the vaporization temperature of the second material.

3. The evaporator according to claim 2, wherein said third material is stainless steel.

4. The evaporator according to claim 1, wherein said shielding means is formed from a third material which will not alloy with the second material.

5. The evaporator according to claim 4, wherein said third material is stainless steel.

6. The evaporator according to claim 1 wherein said shielding means includes a tubular member having sealing means for sealing said tubular member.

7. The evaporator according to claim 6, wherein said escape means includes an aperture formed in said tubular member.

8. The evaporator according to claim 7, further comprising the second material wherein said second material is located inside said tubular member.

9. The evaporator according to claim 8, wherein said tubular member includes opposing ends, said sealing means being located on each of said opposing ends of said tubular member.

10. The evaporator according to claim 9, wherein said sealing means includes at least one crimp in each of said opposing ends of said tubular member.

11. The evaporator according to claim 8, wherein said second material is antimony.

12. An evaporator containing a second material which is to be evaporated onto a remotely located surface after a first evaporation of a first material, comprising:
   a shielding member defining a curved surface, having sealing means for preventing the second material from combining with the first material during the first evaporation thereof and escape means for allowing the escape of said second material from said evaporator during evaporation of said second material, said escape means being located at a flattened area formed on said curved surface.

13. The evaporator according to claim 12, wherein said escape means includes an aperture formed in said flattened area.

14. The evaporator according to claim 12, wherein said sealing means includes at least one crimp formed in said shielding member.

15. The evaporator according to claim 12, wherein said second material is antimony.

16. A method of making an evaporator used for evaporating a second material onto a remotely located surface after a first evaporation of a first material, said method comprising the steps of:

providing shielding means for preventing the second material from combining with the first material during the first evaporation thereof;

flattening a portion of said shielding means; forming escape means for allowing said second material to evaporate onto said remotely located surface; and placing said second material into said shielding means.

17. The method according to claim 16, further comprising the step of sealing said shielding means to further prevent the second material from combining with the first material during the first evaporation thereof.

18. The method according to claim 17, wherein said shielding means includes a tubular member having opposing ends.

19. The method according to claim 18, wherein said step of sealing includes crimping each of said opposing ends of said tubular member.

20. The method according to claim 19, wherein said escape means is an aperture.

21. The method according to claim 17, wherein said second material is Antimony.

* * * * *